US006956316B1

(12) United States Patent
Tessien et al.

(10) Patent No.: US 6,956,316 B1
(45) Date of Patent: Oct. 18, 2005

(54) ACOUSTIC DRIVER ASSEMBLY FOR A SPHERICAL CAVITATION CHAMBER

(75) Inventors: Ross Alan Tessien, Nevada City, CA (US); Dario Felipe Gaitan, Nevada City, CA (US); Daniel A. Phillips, Grass Valley, CA (US)

(73) Assignee: Impulse Devices, Inc., Grass Valley, CA (US)

( * ) Notice: Subject to any disclaimer, the term of this patent is extended or adjusted under 35 U.S.C. 154(b) by 0 days.

(21) Appl. No.: 10/943,679

(22) Filed: Sep. 17, 2004

Related U.S. Application Data

(63) Continuation of application No. 10/931,918, filed on Sep. 1, 2004.

(51) Int. Cl.[7] ........................... B06B 1/06; H01L 41/08

(52) U.S. Cl. ........................... 310/323.12; 310/323.13; 310/323.18; 310/323.19; 310/328; 310/334

(58) Field of Search ............................... 310/334–337, 310/369, 322, 327, 323.12, 323.13, 323.18, 310/323.19, 328

(56) References Cited

U.S. PATENT DOCUMENTS

| | | | | |
|---|---|---|---|---|
| 3,140,859 | A * | 7/1964 | Scarpa | 366/114 |
| 4,333,796 | A | 6/1982 | Flynn | |
| 4,339,247 | A | 7/1982 | Faulkner et al. | |
| 4,563,341 | A | 1/1986 | Flynn | |
| 4,991,152 | A | 2/1991 | Letiche | |
| 5,030,873 | A | 7/1991 | Owen | |
| 5,658,534 | A | 8/1997 | Desborough et al. | |
| 5,659,173 | A * | 8/1997 | Putterman et al. | 250/361 C |
| 5,722,444 | A * | 3/1998 | Prokopenko et al. | 134/184 |
| 5,858,104 | A | 1/1999 | Clark | |

(Continued)

FOREIGN PATENT DOCUMENTS

WO WO 01/39205 5/2001

OTHER PUBLICATIONS

M. Dan et al., Ambient Pressure Effect on Single-Bubble Sonoluminescence, Physical Review Letters, Aug. 30, 1999, Page(s) 1870-1873, vol. 83, No. 9, Published in: US.

(Continued)

*Primary Examiner*—Thomas M. Dougherty
(74) *Attorney, Agent, or Firm*—Patent Law Office of David G. Beck

(57) ABSTRACT

An acoustic driver assembly for use with a spherical cavitation chamber is provided. The acoustic driver assembly includes at least one transducer, a head mass and a tail mass, coupled together with a centrally located threaded means (e.g., all thread, bolt, etc.). The driver assembly is either attached to the exterior surface of the spherical cavitation chamber with the same threaded means, a different threaded means, or a more permanent coupling means such as brazing, diffusion bonding or epoxy. In at least one embodiment, the transducer is comprised of a pair of piezo-electric transducers, preferably with the adjacent surfaces of the piezo-electric transducers having the same polarity. The surface of the head mass that is adjacent to the external surface of the chamber has a spherical curvature greater than the spherical curvature of the external surface of the chamber, thus providing a ring of contact between the acoustic driver and the cavitation chamber. The area of the contact ring is increased in one embodiment by chamfering a portion of the head mass such that the chamfered surface has the same curvature as the external surface of the chamber. In at least one embodiment, a void filling material is interposed between one or more pairs of adjacent surfaces of the driver assembly and/or the driver assembly and the exterior surface of the cavitation chamber.

29 Claims, 6 Drawing Sheets

U.S. PATENT DOCUMENTS

| | | | | |
|---|---|---|---|---|
| 5,994,818 | A | 11/1999 | Abramov et al. | |
| 5,998,908 | A * | 12/1999 | Goodson | 310/325 |
| 6,146,674 | A * | 11/2000 | Manna et al. | 426/238 |
| 6,361,747 | B1 | 3/2002 | Dion et al. | |
| 6,617,765 | B1 | 9/2003 | Lagler et al. | |
| 6,690,621 | B2 | 2/2004 | Porzio | |

OTHER PUBLICATIONS

C. Desilets et al., Analyses and Measurements of Acoustically Matched, Air-Coupled Tonpilz Transducers, IEEE Ultrasonics Symposium Proceedings—1999, Oct. 17, 1999, Page(s) 1045-1048, vol. 2, Publisher: IEEE.

S.C. Butler et al., A Broadband Hybrid Magnetostrictive/Piezoelectric Transducer Array, Magsoft Update, Jul. 2001, Page(s) 1-7, vol. 7, No. 1, Publisher: Magsoft Corporation, Published in: US.

M.J. Lodeiro et al, High Frequency Displacement and Dielectric Measurements in Piezoelectric Materials, CPM8. 1 Characterization of Advanced Functional Materials-Final Project Deliverables, Mar. 2002, Pages(s) 1-12, Volume MATC(MN), No. 21, Publisher: United Kingdom National Physical Laboratory, Published in: United Kingdom.

* cited by examiner

ACOUSTIC DRIVER ASSEMBLY FOR A SPHERICAL CAVITATION CHAMBER

REFERENCE TO RELATED APPLICATIONS

This application is a continuation of U.S. patent application Ser. No. 10/931,918, filed Sep. 1, 2004.

FIELD OF THE INVENTION

The present invention relates generally to sonoluminescence and, more particularly, to an acoustic driver assembly for use with a sonoluminescence cavitation chamber.

BACKGROUND OF THE INVENTION

Sonoluminescence is a well-known phenomena discovered in the 1930's in which light is generated when a liquid is cavitated. Although a variety of techniques for cavitating the liquid are known (e.g., spark discharge, laser pulse, flowing the liquid through a Venturi tube), one of the most common techniques is through the application of high intensity sound waves.

In essence, the cavitation process consists of three stages; bubble formation, growth and subsequent collapse. The bubble or bubbles cavitated during this process absorb the applied energy, for example sound energy, and then release the energy in the form of light emission during an extremely brief period of time. The intensity of the generated light depends on a variety of factors including the physical properties of the liquid (e.g., density, surface tension, vapor pressure, chemical structure, temperature, hydrostatic pressure, etc.) and the applied energy (e.g., sound wave amplitude, sound wave frequency, etc.).

Although it is generally recognized that during the collapse of a cavitating bubble extremely high temperature plasmas are developed, leading to the observed sonoluminescence effect, many aspects of the phenomena have not yet been characterized. As such, the phenomena is at the heart of a considerable amount of research as scientists attempt to not only completely characterize the phenomena (e.g., effects of pressure on the cavitating medium), but also its many applications (e.g., sonochemistry, chemical detoxification, ultrasonic cleaning, etc.).

Although acoustic drivers are commonly used to drive the cavitation process, there is little information about methods of coupling the acoustic energy to the cavitation chamber. For example, in an article entitled *Ambient Pressure Effect on Single-Bubble Sonoluminescence* by Dan et al. published in vol. 83, no. 9 of Physical Review Letters, the authors describe their study of the effects of ambient pressure on bubble dynamics and single bubble sonoluminescence. Although the authors describe their experimental apparatus in some detail, they only disclose that a piezoelectric transducer was used at the fundamental frequency of the chamber, not how the transducer couples its energy into the chamber.

U.S. Pat. No. 4,333,796 discloses a cavitation chamber that is generally cylindrical although the inventors note that other shapes, such as spherical, can also be used. As disclosed, the chamber is comprised of a refractory metal such as tungsten, titanium, molybdenum, rhenium or some alloy thereof and the cavitation medium is a liquid metal such as lithium or an alloy thereof. Surrounding the cavitation chamber is a housing which is purportedly used as a neutron and tritium shield. Projecting through both the outer housing and the cavitation chamber walls are a number of acoustic horns, each of the acoustic horns being coupled to a transducer which supplies the mechanical energy to the associated horn. The specification only discloses that the horns, through the use of flanges, are secured to the chamber/housing walls in such a way as to provide a seal and that the transducers are mounted to the outer ends of the horns.

U.S. Pat. No. 5,658,534 discloses a sonochemical apparatus consisting of a stainless steel tube about which ultrasonic transducers are affixed. The patent provides considerable detail as to the method of coupling the transducers to the tube. In particular, the patent discloses a transducer fixed to a cylindrical half-wavelength coupler by a stud, the coupler being clamped within a stainless steel collar welded to the outside of the sonochemical tube. The collars allow circulation of oil through the collar and an external heat exchanger. The abutting faces of the coupler and the transducer assembly are smooth and flat. The energy produced by the transducer passes through the coupler into the oil and then from the oil into the wall of the sonochemical tube.

U.S. Pat. No. 5,659,173 discloses a sonoluminescence system that uses a transparent spherical flask. The spherical flask is not described in detail, although the specification discloses that flasks of Pyrex®, Kontes®, and glass were used with sizes ranging from 10 milliliters to 5 liters. The drivers as well as a microphone piezoelectric were simply epoxied to the exterior surface of the chamber.

U.S. Pat. No. 5,858,104 discloses a shock wave chamber partially filled with a liquid. The remaining portion of the chamber is filled with gas which can be pressurized by a connected pressure source. Acoustic transducers are used to position an object within the chamber while another transducer delivers a compressional acoustic shock wave into the liquid. A flexible membrane separating the liquid from the gas reflects the compressional shock wave as a dilation wave focused on the location of the object about which a bubble is formed. The patent simply discloses that the transducers are mounted in the chamber walls without stating how the transducers are to be mounted.

U.S. Pat. No. 5,994,818 discloses a transducer assembly for use with tubular resonator cavity rather than a cavitation chamber. The assembly includes a piezoelectric transducer coupled to a cylindrical shaped transducer block. The transducer block is coupled via a central threaded bolt to a wave guide which, in turn, is coupled to the tubular resonator cavity. The transducer, transducer block, wave guide and resonator cavity are co-axial along a common central longitudinal axis. The outer surface of the end of the wave guide and the inner surface of the end of the resonator cavity are each threaded, thus allowing the wave guide to be threadably and rigidly coupled to the resonator cavity.

U.S. Pat. No. 6,361,747 discloses an acoustic cavitation reactor in which the reactor chamber is comprised of a flexible tube. The liquid to be treated circulates through the tube. Electroacoustic transducers are radially and uniformly distributed around the tube, each of the electroacoustic transducers having a prismatic bar shape. A film of lubricant is interposed between the transducer heads and the wall of the tube to help couple the acoustic energy into the tube.

PCT Application No. US00/32092 discloses several driver assembly configurations for use with a solid cavitation reactor. The disclosed reactor system is comprised of a solid spherical reactor with multiple integral extensions surrounded by a high pressure enclosure. Individual driver assemblies are coupled to each of the reactor's integral extensions, the coupling means sealed to the reactor's enclosure in order to maintain the high pressure characteristics of the enclosure.

Although a variety of cavitation systems have been designed, these systems typically provide inadequate coupling of the acoustic energy to the cavitation chamber. Accordingly, what is needed in the art is an acoustic driver assembly that efficiently couples energy to the cavitation chamber while being relatively easy to manufacture. The present invention provides such a system.

SUMMARY OF THE INVENTION

The present invention provides an acoustic driver assembly for use with a spherical cavitation chamber. The acoustic driver assembly includes at least one transducer, a head mass and a tail mass, coupled together with a centrally located threaded means (e.g., all thread, bolt, etc.). The driver assembly is either attached to the exterior surface of the spherical cavitation chamber with the same threaded means, a different threaded means, or a more permanent coupling means such as brazing, diffusion bonding or epoxy. In at least one embodiment, the transducer is comprised of a pair of piezo-electric transducers, preferably with the adjacent surfaces of the piezo-electric transducers having the same polarity. The surface of the head mass that is adjacent to the external surface of the chamber has a spherical curvature greater than the spherical curvature of the external surface of the chamber, thus providing a ring of contact between the acoustic driver and the cavitation chamber. The area of the contact ring is increased in one embodiment by chamfering a portion of the head mass such that the chamfered surface has the same curvature as the external surface of the chamber. In at least one embodiment, a void filling material is interposed between one or more pairs of adjacent surfaces of the driver assembly and/or the driver assembly and the exterior surface of the cavitation chamber.

A further understanding of the nature and advantages of the present invention may be realized by reference to the remaining portions of the specification and the drawings.

DESCRIPTION OF THE SPECIFIC EMBODIMENTS

Figure 1:
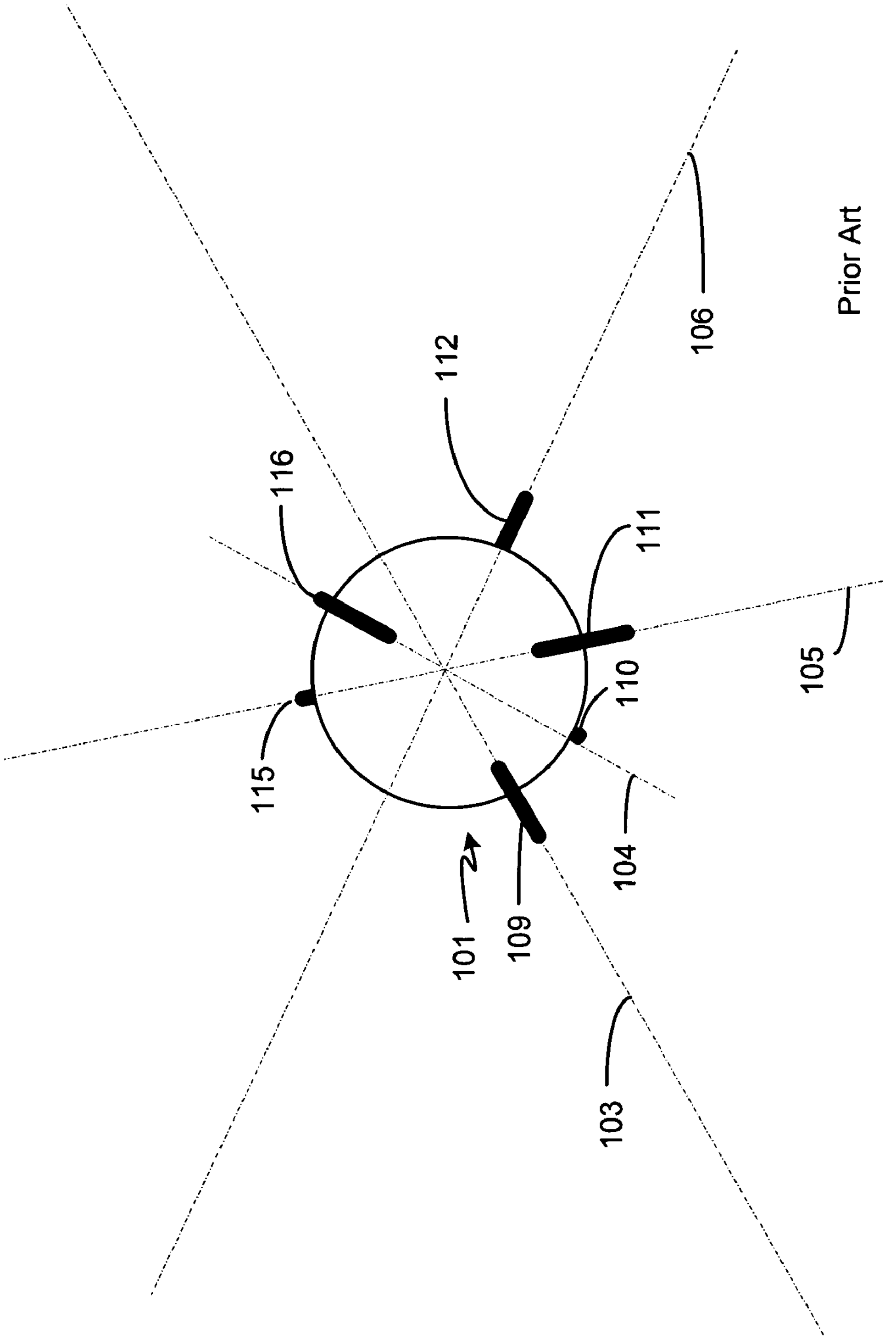
FIG. 1 is an illustration of a spherical sonoluminescence cavitation chamber without ports in accordance with the prior art.

FIG. 1 is an illustration of a spherical sonoluminescence cavitation chamber 101, hereafter referred to as simply a cavitation chamber, according to the prior art. Transducers 109–112 are mounted to the lower hemisphere of chamber 101 and transducers 115–116 are mounted to the upper hemisphere of chamber 101.

Figure 2:
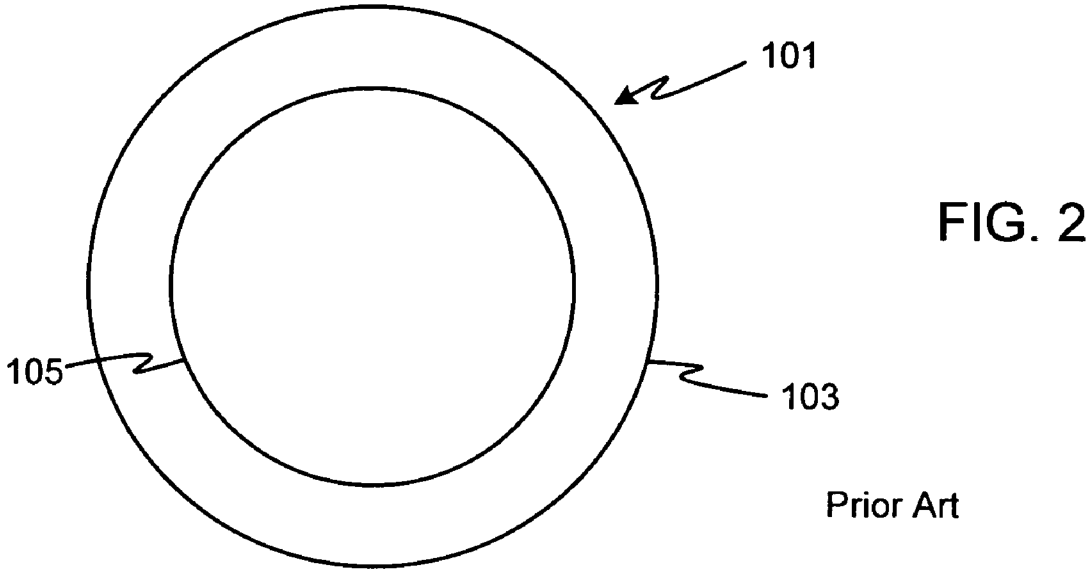
FIG. 2 Prior Art
FIG. 2 is a cross-sectional view of the spherical cavitation chamber shown in FIG. 1.

FIG. 2 is a cross-sectional view of spherical cavitation chamber 101. Chamber 101 has an outer spherical surface 103 defining the outer diameter of the chamber, and an inner spherical surface 105 defining the inner diameter of the chamber. The fabrication of a spherical chamber is described in detail in co-pending application Ser. No. 10/925,070, filed Aug. 23, 2004, entitled Method of Fabricating a Spherical Cavitation Chamber, the disclosure of which is incorporated herein for any and all purposes.

Chamber 101 can be fabricated from any of a variety of materials, depending primarily on the desired operating temperature and pressure, as well as the fabrication techniques used to make the chamber. Typically the chamber is fabricated from a metal; either a pure metal or an alloy such as stainless steel.

With respect to the dimensions of the chamber, both inner and outer diameters, the selected sizes depend upon the intended use of the chamber. For example, smaller chambers are typically preferable for situations in which the applied energy (e.g., acoustic energy) is somewhat limited. Similarly, thick chamber walls are preferable if the chamber is to be operated at high static pressures. For example, the prior art discloses wall thicknesses of 0.25 inches, 0.5 inches, 0.75 inches, 1.5 inches, 2.375 inches, 3.5 inches and 4 inches, and outside diameters in the range of 2–10 inches. It should be appreciated, however, that the present invention is not limited to a particular outside chamber diameter, inside chamber diameter, chamber material, chamber shape, transducer number, or transducer mounting location. Such information, as provided herein, is only meant to provide exemplary chamber configurations for which the present invention is applicable.

Figure 3:
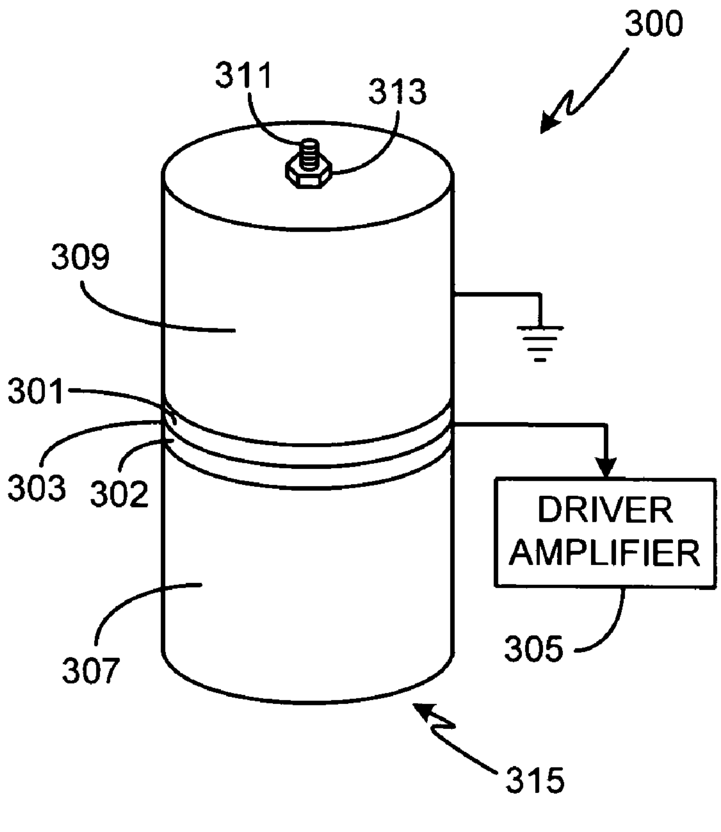
FIG. 3 is an illustration of a driver assembly fabricated in accordance with the invention.
Figure 4:
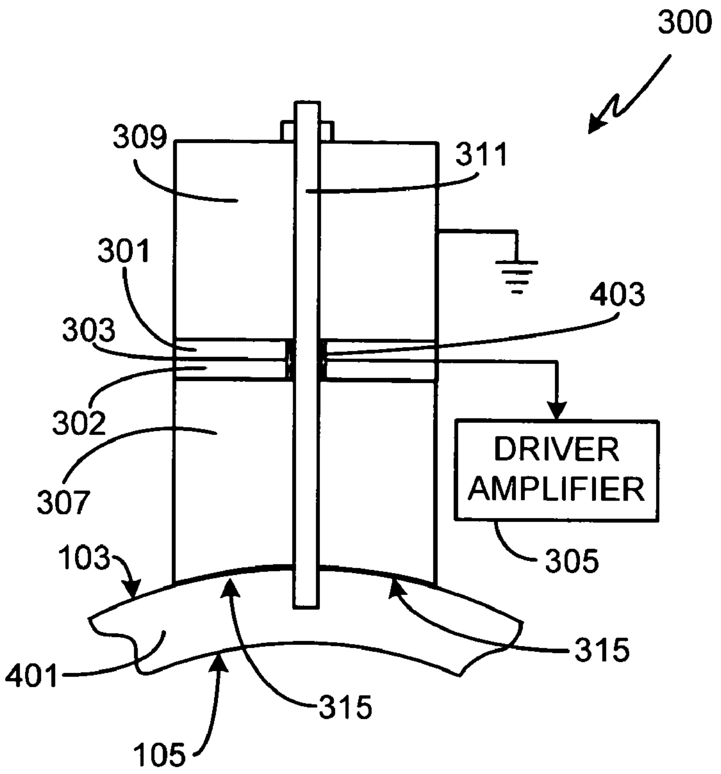
FIG. 4 is a cross-sectional view of the driver assembly of FIG. 3 attached to a spherical cavitation chamber such as the chamber illustrated in FIG. 1.

FIG. 3 is a perspective view of a driver assembly 300 in accordance with the invention. FIG. 4 is a cross-sectional view of a preferred embodiment of driver assembly 300 attached to cavitation chamber 101. Preferably piezo-electric transducers are used in driver 300 although magnetostrictive transducers can also be used, magnetostrictive transducers typically preferred when lower frequencies are desired. A combination of piezo-electric and magnetostrictive transducers can also be used, for example as a means of providing greater frequency bandwidths.

Driver assembly 300 can use a single piezo-electric transducer or a transducer stack. In the preferred embodiment assembly 300 uses a pair of piezo-electric transducer rings 301 and 302 poled in opposite directions. By using a pair of transducers in which the adjacent surfaces of the two crystals have the same polarity, potential grounding problems are minimized. An electrode disc 303 is located between transducer rings 301 and 302 which, during operation, is coupled to the driver power amplifier 305.

The transducer pair is sandwiched between a head mass 307 and a tail mass 309. In the preferred embodiment both head mass 307 and tail mass 309 are fabricated from stainless steel and are of equal mass. In alternate embodiments head mass 307 and tail mass 309 are fabricated from different materials. In yet other alternate embodiments, head mass 307 and tail mass 309 have different masses and/or different mass diameters and/or different mass lengths. For example tail mass 309 can be much larger than head mass 307.

Driver 300 is assembled about a centrally located all-thread 311 which is screwed directly into wall 401 of chamber 101. A cap nut 313 holds the assembly together. As shown, preferably all-thread 311 does not pass through the entire chamber wall, thus leaving the internal chamber surface 105 smooth and preventing gas or liquid leaks at the point of driver attachment. Alternately, for example with thin walled chambers, the threaded hole to which all-thread 311 is coupled passes through the entire chamber wall. Typically in such an embodiment all-thread 311 does not pass through the entire chamber wall but is sealed into place with an epoxy or other suitable sealant. It is understood that all-thread 311 and cap nut 313 can be replaced with a bolt. An insulating sleeve 403 isolates all-thread 311, preventing it from shorting electrode 303.

End surface 315 of driver assembly 300 is preferably spherically shaped with a curvature matching that of external chamber surface 103. This design insures the efficient transfer of acoustic energy into chamber 101.

In a preferred embodiment of the invention, acoustic driver assembly 300 is approximately 2.5 inches in diameter, tail mass 309 and head mass 307 each weigh approximately 5 pounds and are fabricated from 17-4 PH stainless steel, and a pair of piezo-electric transducers fabricated by Channel Industries of Santa Barbara, Calif. is used. Driver 300 is assembled about a 0.5 inch all-thread 311, insulating sleeve 403 is fabricated from Teflon and the assembly is tightened to 120 ft-lbs.

Figure 5:
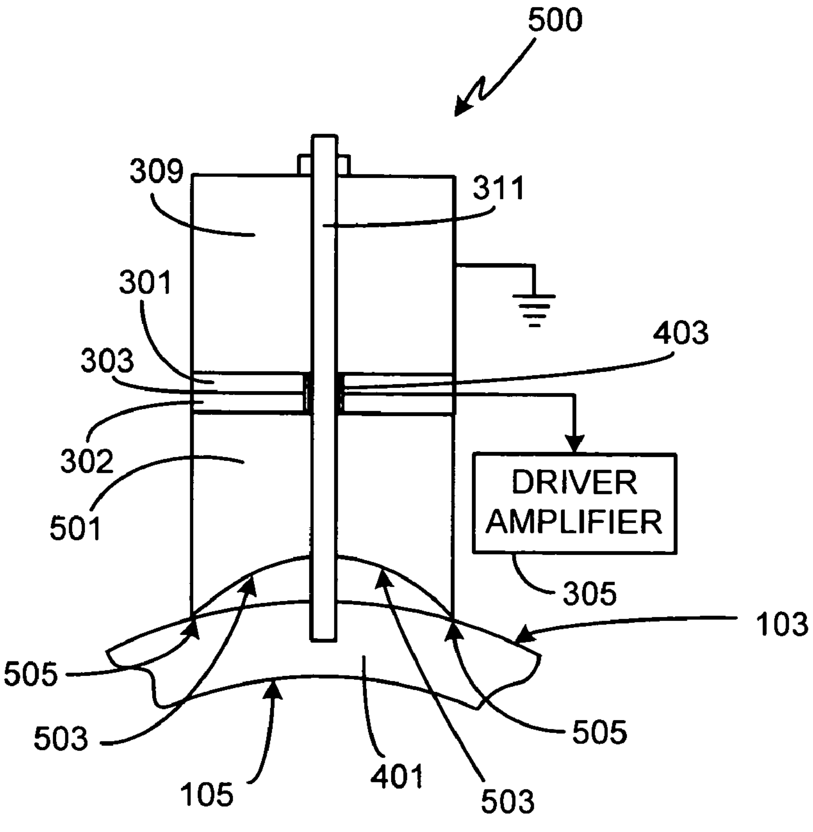
FIG. 5 is a cross-sectional view of a driver assembly with an alternate head mass shape.
Figure 6:
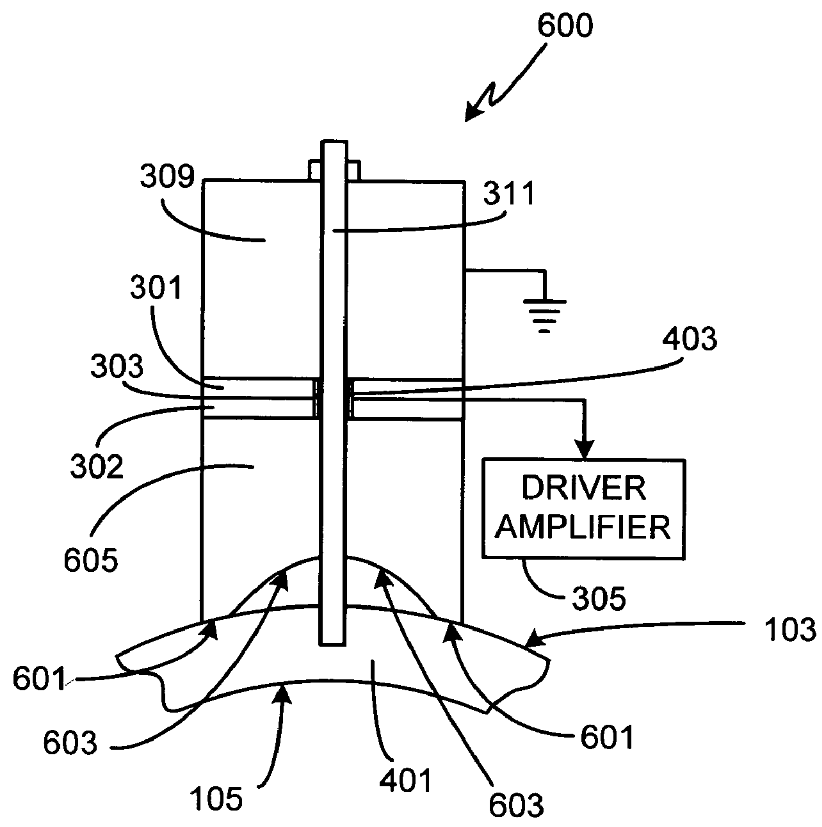
FIG. 6 is a cross-sectional view of a driver assembly with an alternate head mass shape.

FIG. 5 is a cross-sectional view of an alternate embodiment of the invention. The majority of driver assembly 500 is the same as driver assembly 300, equivalent components represented through the use of the same component labels. Driver assembly 500, however, uses a head mass 501 in which end surface 503 has a curvature greater than that of external chamber surface 103. As a result, rather than having the entire end surface being in contact with the external chamber surface 103, only a ring 505 of contact is made between the two surfaces. If desired, the contact area 601 can be increased by chamfering the contact area of end surface 603 of the head mass 605 as illustrated in FIG. 6.

Figure 7:
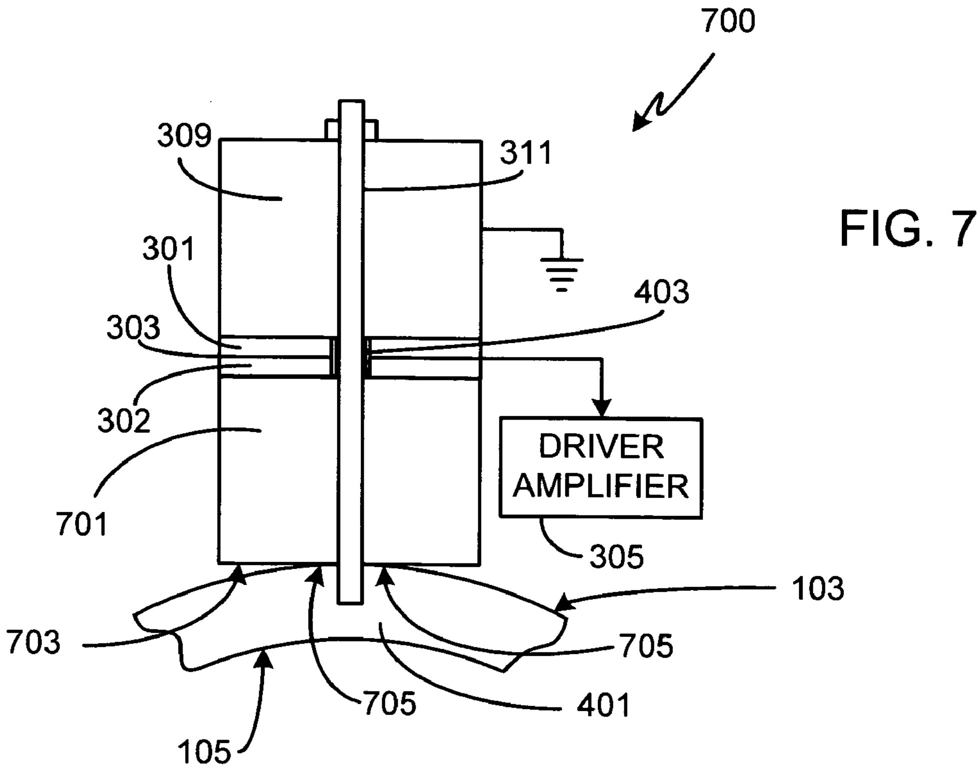
FIG. 7 is a cross-sectional view of a driver assembly with an alternate head mass shape.

FIG. 7 is a cross-sectional view of an alternate embodiment of the invention. As in FIGS. 5 and 6, the use of the same component labels indicates component equivalency. Driver assembly 700 uses a head mass 701 in which end surface 703 has a curvature less than that of the external surface of chamber 101. For example, as shown, end surface 703 is flat, leading to only a small portion 705 of surface 703 being in contact with external chamber surface 103. A similar result can be obtained by having the curvature of surface 703 be less than that of external surface 103, but more than a flat surface (not shown). Alternately, the curvature of head mass 307 can be inverted (not shown), also resulting in minimal contact between the two surfaces, the contact area being located around the central portion of the driver assembly.

Figure 8:
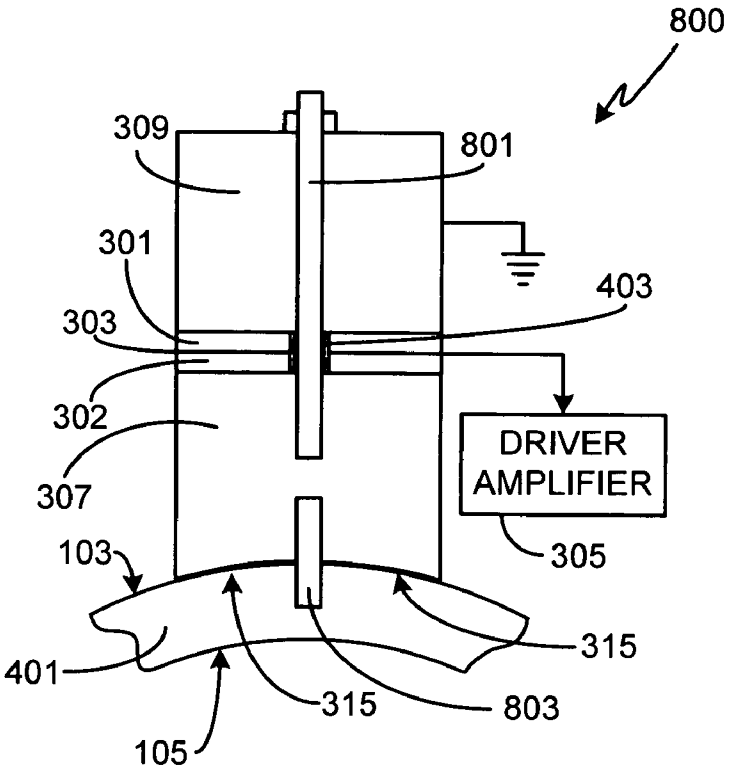
FIG. 8 is a cross-sectional view of an alternate driver assembly in which the head mass coupling means is independent of the driver assembly coupling means.

In an alternate embodiment shown in FIG. 8, the driver is assembled about a first threaded means 801 (e.g., all-thread or bolt) which is threaded into head mass 307. Coupling means, for example an all-thread member 803 as shown, is used to couple driver assembly 800 to wall 401 of chamber 101. The principal benefit of this configuration is that the driver assembly is independent of the driver-chamber coupling means. As a result, a driver can be attached to, or detached from, a cavitation chamber without disassembling the actual driver assembly. This is especially beneficial given the susceptibility of piezo-electric crystals to damage. It is understood that this aspect of the invention is not limited to head mass 307, rather it is equally applicable to head mass 501, head mass 605 or head mass 701. It is also understood that the coupling means between the head mass and the cavitation chamber surface is not limited to all-thread 803; other means such as adhesives (e.g., epoxy) are clearly envisioned by the inventors.

Figure 9:
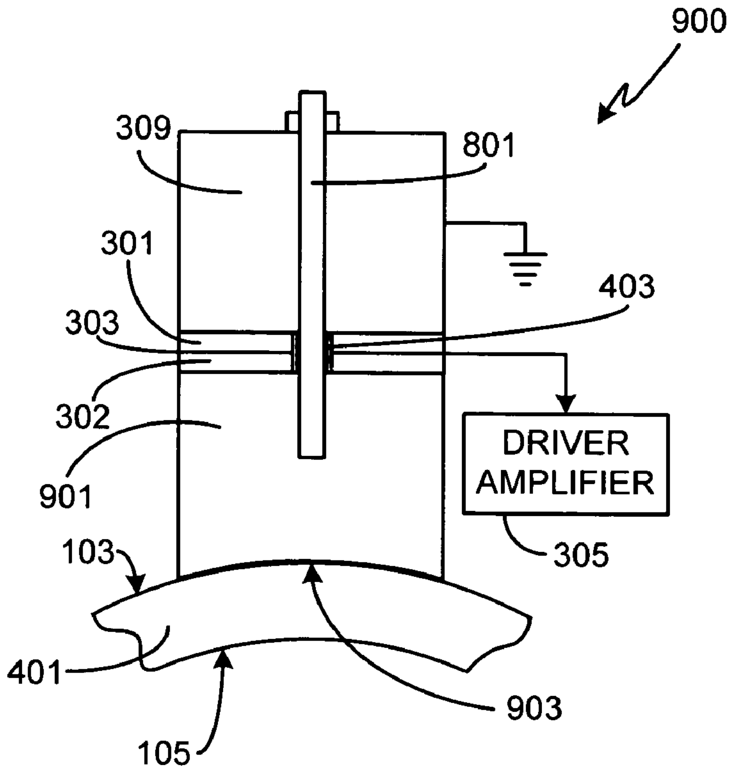
FIG. 9 is a cross-sectional view of an alternate driver assembly in which the head mass is permanently coupled to the cavitation chamber exterior surface.
Figure 10:
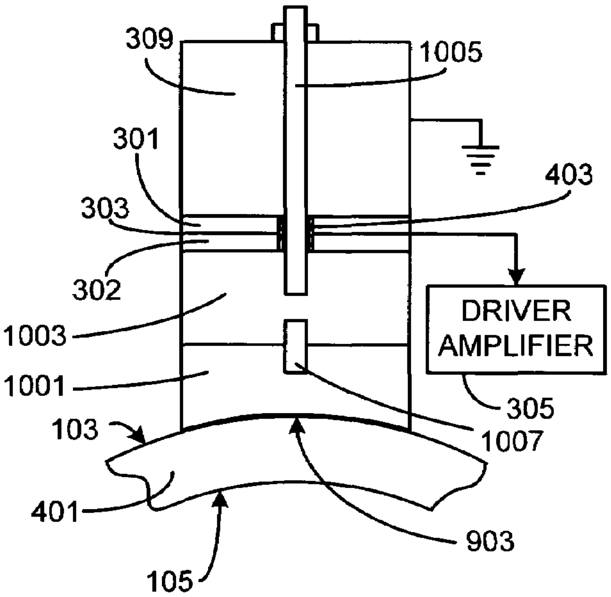
FIG. 10 is a cross-sectional view of an alternate driver assembly in which the head mass is comprised of a first portion permanently coupled to the cavitation chamber exterior surface and a second portion associated with the driver assembly.

FIG. 9 is an illustration of an alternate embodiment in which the head mass of the driver assembly is permanently coupled to the chamber. As shown, head mass 901 is attached to chamber exterior surface 103 along surface 903. For small drivers, head mass 901 can be bonded to chamber surface 103, for example with an epoxy. Due to the mass of larger drivers, and due to the vibration inherent in the assembly when operating, a more permanent coupling technique is preferred. Brazing is the preferred coupling technique although alternate techniques such as diffusion bonding are also acceptable. As the head mass in this embodiment is permanently coupled to the chamber surface, a threaded means such as all-thread 311 or 803 is not required although the embodiment does require a driver assembly threaded means 801. If desired, and as a means of allowing the driver assembly to be assembled/disassembled separately from the chamber/head mass assembly, a two-piece head mass assembly can be used as illustrated in FIG. 10. As shown, a first head mass portion 1001 is bonded to chamber exterior surface 103, for example via brazing or diffusion bonding as noted above, while a second head mass portion 1003 is coupled to the driver assembly via threaded means 1005. A second threaded means 1007 couples head mass portion 1001 to head mass portion 1003.

Micro-surface imperfections, such as those between the head mass and the chamber exterior surface, impair efficient coupling of acoustic energy into the chamber. Accordingly bonding the head mass to the chamber as described above relative to FIGS. 9 and 10 has been found to improve acoustic energy coupling efficiency. For similar reasons it has been found that the inclusion of a void filling material between adjacent pairs of surfaces of the driver assembly and/or the driver assembly and the exterior surface of the cavitation chamber improves the overall coupling efficiency and operation of the driver. Therefore in the preferred embodiment of the invention a void filling material is interposed between one or more pairs of adjacent surfaces of the assembly. For example, such material can be included between the head mass and transducer 302, and/or between transducer 302 and electrode 303, and/or between electrode 303 and transducer 301, and/or between transducer 301 and the tail mass. Further, if the head mass is not permanently bonded to the chamber exterior surface as described above, preferably void filling material is interposed between the adjacent surfaces of the head mass and the exterior chamber surface. Further, if the head mass is comprised of two portions as described relative to FIG. 10, preferably void filling material is interposed between the adjacent surfaces of the two head mass portions. Suitable void filling material should be sufficiently compressible to fill the voids or surface imperfections of the adjacent surfaces while not being so compressible as to overly dampen the acoustic energy supplied by the transducers. Preferably the void filling material is a high viscosity grease, although wax, very soft metals (e.g., solder), or other materials can be used.

Figure 11:
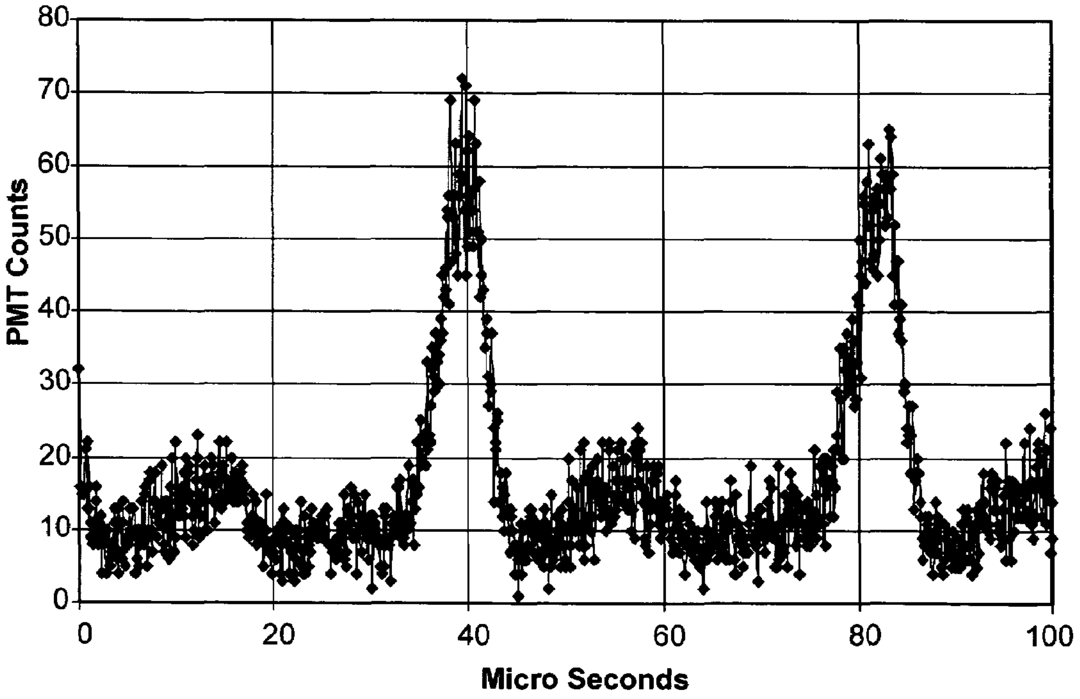
FIG. 11 is a graph of measured sonoluminescence data taken with a spherical cavitation chamber and a driver assembly in accordance with the invention.

FIG. 11 is a graph that illustrates the sonoluminescence effect with a spherical cavitation sphere and six acoustic driver assemblies fabricated in accordance with the invention. The drivers were mounted as illustrated in FIG. 1. The sphere was fabricated from 17-4 stainless steel and had an outer diameter of 9.5 inches and an inner diameter of 8 inches. For the data shown in FIG. 11, the liquid within the chamber was acetone. During operation, the temperature of the acetone was −27.5° C. The driving frequency was 23.52 kHz, the driving amplitude was 59 V RMS, and the driving power was 8.8 watts. Two acoustic cycles are shown in FIG. 11. It will be appreciated that the data shown in FIG. 11 is only provided for illustration, and that the invention is not limited to this specific configuration.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A cavitation system, comprising:

a spherical cavitation chamber, comprising:

an external surface defined by a spherical curvature; and an internal surface, wherein said spherical cavitation chamber external surface and said spherical cavitation chamber internal surface define a spherical cavitation chamber wall;

an acoustic driver assembly coupled to said spherical cavitation chamber, comprising:

at least one piezo-electric transducer;

a tail mass adjacent to a first side of said at least one piezo-electric transducer;

a head mass with a first end surface and a second end surface, wherein said first end surface of said head mass is adjacent to a second side of said at least one piezo-electric transducer and said second end surface of said head mass is adjacent to a portion of said spherical cavitation chamber external surface, wherein said second end surface of said head mass has a spherical curvature greater than said spherical curvature of said spherical cavitation chamber external surface, wherein a portion of said second end surface of said head mass is chamfered, and wherein said chamfered surface has a curvature equivalent to said spherical curvature of said spherical cavitation chamber external surface, said chamfered surface corresponding to a ring of contact between said second end surface of said head mass and said spherical cavitation chamber external surface; and a centrally located threaded means coupling said tail mass, said at least one piezo-electric transducer and said head mass to said spherical cavitation chamber external surface, wherein said centrally located threaded means is threaded into a corresponding threaded hole in said spherical cavitation chamber external surface, wherein said threaded hole extends at least part way through said spherical cavitation chamber wall.

2. The cavitation system of claim 1, wherein said at least one piezo-electric transducer is comprised of a first and a second piezo-electric transducer, wherein adjacent surfaces of said first and second piezo-electric transducers have the same polarity.

3. The cavitation system of claim 2, further comprising an electrode interposed between said adjacent surfaces of said first and second piezo-electric transducers.

4. The cavitation system of claim 1, further comprising an insulating sleeve surrounding a portion of said centrally located threaded means, wherein said insulating sleeve is interposed between said centrally located threaded means and said at least one piezo-electric transducer.

5. The cavitation system of claim 1, said centrally located threaded means further comprising a corresponding threaded nut, wherein said threaded nut compresses said tail mass, said at least one piezo-electric transducer and said head mass against said spherical cavitation chamber external surface.

6. The cavitation system of claim 1, wherein said tail mass and said head mass are of approximately equal mass.

7. The cavitation system of claim 1, wherein said tail mass and said head mass are comprised of stainless steel.

8. The cavitation system of claim 1, further comprising a void filling material interposed between adjacent contact surfaces of said second surface of said head mass and said spherical cavitation chamber external surface.

9. The cavitation system of claim 1, further comprising a void filling material interposed between said first surface of said head mass and said second side of said at least on piezo-electric transducer.

10. The cavitation system of claim 2, further comprising a void filling material interposed between said adjacent surfaces of said first and second piezo-electric transducers.

11. The cavitation system of claim 1, further comprising a void filling material interposed between said first side of said at least one piezo-electric transducer and said tail mass.

12. The cavitation system of claim 1, wherein said threaded hole extends completely through said spherical cavitation chamber wall, and wherein said acoustic driver assembly further comprises a sealant interposed between said threaded means and said threaded hole.

13. A cavitation system, comprising:

a spherical cavitation chamber, comprising:

an external surface defined by a spherical curvature; and an internal surface, wherein said spherical cavitation chamber external surface and said spherical cavitation chamber internal surface define a spherical cavitation chamber wall;

an acoustic driver assembly coupled to said spherical cavitation chamber, comprising:

at least one piezo-electric transducer;

a tail mass adjacent to a first side of said at least one piezo-electric transducer;

a head mass with a first end surface and a second end surface, wherein said first end surface of said head mass is adjacent to a second side of said at least one piezo-electric transducer and said second end surface of said head mass is adjacent to a portion of said spherical cavitation chamber external surface, wherein said second end surface of said head mass has a spherical curvature greater than said spherical curvature of said spherical cavitation chamber external surface; and a first centrally located threaded means coupling said tail mass, said at least one piezo-electric transducer and said head mass together, wherein said first centrally located threaded means is threaded into a corresponding threaded hole in said head mass; and coupling means for coupling said head mass of said acoustic driver assembly to said spherical cavitation chamber external surface.

14. The cavitation system of claim 13, wherein said coupling means is comprised of an epoxy.

15. The cavitation system of claim 13, wherein said coupling means is comprised of a second centrally located threaded means, wherein a first end portion of said second centrally located threaded means is threaded into said head mass and a second end portion of said second centrally located threaded means is threaded into a corresponding threaded hole in said spherical cavitation chamber external surface.

16. The cavitation system of claim 13, wherein said at least one piezo-electric transducer is comprised of a first and a second piezo-electric transducer, wherein adjacent surfaces of said first and second piezo-electric transducers have the same polarity.

17. The cavitation system of claim 16, further comprising an electrode interposed between adjacent surfaces of said first and second piezo-electric transducers.

18. The cavitation system of claim 13, further comprising an insulating sleeve surrounding a portion of said first centrally located threaded means, wherein said insulating sleeve is interposed between said first centrally located threaded means and said at least one piezo-electric transducer.

19. The cavitation system of claim 13, said first centrally located threaded means further comprising a corresponding threaded nut, wherein said threaded nut compresses said tail mass and said at least one piezo-electric transducer against said head mass.

20. The cavitation system of claim 13, wherein said tail mass and said head mass are of approximately equal mass.

21. The cavitation system of claim 13, wherein said tail mass and said head mass are comprised of stainless steel.

22. The cavitation system of claim 13, further comprising a void filling material interposed between said second surface of said head mass and said spherical cavitation chamber external surface.

23. The cavitation system of claim 13, further comprising a void filling material interposed between said first surface of said head mass and said second side of said at least on piezo-electric transducer.

24. The cavitation system of claim 16, further comprising a void filling material interposed between said adjacent surfaces of said first and second piezo-electric transducers.

25. The cavitation system of claim 13, further comprising a void filling material interposed between said first side of said at least one piezo-electric transducer and said tail mass.

26. The cavitation system of claim 13, wherein a portion of said second end surface of said head mass is chamfered, and wherein said chamfered surface has a curvature equivalent to said spherical curvature of said spherical cavitation chamber external surface, said chamfered surface corresponding to a ring of contact between said second end surface of said head mass and said spherical cavitation chamber external surface.

27. A cavitation system, comprising:

a spherical cavitation chamber, comprising:

an external surface defined by a spherical curvature; and an internal surface, wherein said spherical cavitation chamber external surface and said spherical cavitation chamber internal surface define a spherical cavitation chamber wall;

an acoustic driver assembly coupled to said spherical cavitation chamber, comprising:

a first piezo-electric transducer with a first surface and a second surface;

a second piezo-electric transducer with a first surface and a second surface, wherein said first surface of said first piezo-electric transducer and said first surface of said second piezo-electric transducer are in electrical contact, and wherein a polarity corresponding to said first surface of said first piezo-electric transducer is equivalent to a polarity corresponding to said first surface of said second piezo-electric transducer;

a tail mass adjacent to said second side of said first piezo-electric transducer;

a head mass with a first end surface and a second end surface, wherein said first end surface of said head mass is adjacent to said second side of said second piezo-electric transducer and said second end surface of said head mass is adjacent to a portion of said spherical cavitation chamber external surface, wherein said second end surface of said head mass has a spherical curvature greater than said spherical curvature of said spherical cavitation chamber external surface, wherein a portion of said second end surface of said head mass is chamfered, and wherein said chamfered surface has a curvature equivalent to said spherical curvature of said spherical cavitation chamber external surface, said chamfered surface corresponding to a ring of contact between said second end surface of said head mass and said spherical cavitation chamber external surface;

a centrally located threaded means coupling said tail mass, said first piezo-electric transducer, said second piezo-electric transducer and said head mass to said spherical cavitation chamber external surface, wherein said centrally located threaded means is threaded into a corresponding threaded hole in said spherical cavitation chamber external surface, wherein said threaded hole extends part way through said spherical cavitation chamber wall; and an insulating sleeve surrounding a portion of said centrally located threaded means, wherein said insulating sleeve electrically insulates said first and second piezo-electric transducers from said centrally located threaded means.

28. A cavitation system, comprising:

a spherical cavitation chamber, comprising:

an external surface defined by a spherical curvature; and an internal surface, wherein said spherical cavitation chamber external surface and said spherical cavitation chamber internal surface define a spherical cavitation chamber wall;

an acoustic driver assembly coupled to said spherical cavitation chamber, comprising:

a first piezo-electric transducer with a first surface and a second surface;

a second piezo-electric transducer with a first surface and a second surface, wherein said first surface of said first piezo-electric transducer and said first surface of said second piezo-electric transducer are in electrical contact, and wherein a polarity corresponding to said first surface of said first piezo-electric transducer is equivalent to a polarity corresponding to said first surface of said second piezo-electric transducer;

a tail mass adjacent to said second side of said first piezo-electric transducer;

a head mass with a first end surface and a second end surface, wherein said first end surface of said head mass is adjacent to said second side of said second piezo-electric transducer and said second end surface of said head mass is adjacent to a portion of said spherical cavitation chamber external surface, wherein said second end surface of said head mass has a spherical curvature greater than said spherical curvature of said spherical cavitation chamber external surface;

a first centrally located threaded means coupling said tail mass, said at least one piezo-electric transducer and said head mass together, wherein said first centrally located threaded means is threaded into a corresponding threaded hole in said head mass;

a second centrally located threaded means, wherein a first end portion of said second centrally located threaded means is threaded into said head mass and a second end portion of said second centrally located threaded means is threaded into a corresponding threaded hole in said spherical cavitation chamber external surface; and an insulating sleeve surrounding a portion of said first centrally located threaded means, wherein said insulating sleeve electrically insulates said first and second piezo-electric transducers from said first centrally located threaded means.

29. The cavitation system of claim 28, wherein a portion of said second end surface of said head mass is chamfered, and wherein said chamfered surface has a curvature equivalent to said spherical curvature of said spherical cavitation chamber external surface, said chamfered surface corresponding to a ring of contact between said second end surface of said head mass and said spherical cavitation chamber external surface.

* * * * *